United States Patent
Li et al.

(10) Patent No.: US 10,056,914 B2
(45) Date of Patent: Aug. 21, 2018

(54) FREQUENCY-DOMAIN ADC FLASH CALIBRATION

(71) Applicant: ANALOG DEVICES GLOBAL, Hamilton (BM)

(72) Inventors: Zhao Li, Toronto (CA); Hajime Shibata, Toronto (CA); Trevor Clifford Caldwell, Toronto (CA); Richard E. Schreier, Toronto (CA); Victor Kozlov, Toronto (CA); David Nelson Alldred, Toronto (CA); Prawal Man Shrestha, Somerville, MA (US)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 15/282,586

(22) Filed: Sep. 30, 2016

(65) Prior Publication Data
US 2017/0179971 A1 Jun. 22, 2017

Related U.S. Application Data (60) Provisional application No. 62/269,656, filed on Dec. 18, 2015.

(51) Int. Cl.
*H03M 1/10* (2006.01)
*H03M 1/36* (2006.01)
*H03M 3/00* (2006.01)

(52) U.S. Cl.
CPC ....... *H03M 1/1023* (2013.01); *H03M 1/1004* (2013.01); *H03M 1/1038* (2013.01);
(Continued)

(58) Field of Classification Search
CPC .................................................. H03M 1/1023
(Continued)

(56) References Cited

U.S. PATENT DOCUMENTS

| | | | | |
|---|---|---|---|---|
| 7,227,479 B1* | 6/2007 | Chen | ................... | H03M 1/1004 341/118 |
| 8,290,031 B1* | 10/2012 | Murmann | .............. | H04B 17/11 370/241 |

(Continued)

FOREIGN PATENT DOCUMENTS

| | | |
|---|---|---|
| EP | 2779466 | 9/2014 |
| WO | 2011/114392 | 9/2011 |

OTHER PUBLICATIONS

EP Search Report issued in EP Patent Application Serial No. 16201917.8 dated Apr. 20, 2017, 8 pages.
(Continued)

*Primary Examiner* — Peguy Jean Pierre
(74) *Attorney, Agent, or Firm* — Patent Capital Group (57) ABSTRACT

A flash analog-to-digital converter (ADC) includes comparators that convert an analog input signal to a digital output signal. Offsets of these comparators introduce noise and can hurt the performance of the ADC. Thus, these comparators are calibrated using calibration codes. Conventional calibration methods determine these calibration codes by removing the ADC from an input signal. Otherwise, it is difficult to distinguish the noise from the signal in the calibration measurement. In contrast, an embodiment can determine the calibration codes while the ADC converts the input signal to a digital signal. Such an embodiment can be achieved by a frequency-domain technique. In an embodiment employing a frequency-domain power meter, an input signal can be removed from the power measurement. This removal enables accurate measurement of in-band noise without having the measurement be corrupted by input signal power.

21 Claims, 6 Drawing Sheets

(52) U.S. Cl.
CPC ......... *H03M 1/1085* (2013.01); *H03M 1/361* (2013.01); *H03M 3/378* (2013.01); *H03M 3/384* (2013.01)

(58) Field of Classification Search
USPC .................................. 341/118, 120, 155, 143
See application file for complete search history.

(56) References Cited

U.S. PATENT DOCUMENTS

| | | | |
|---|---|---|---|
| 8,773,966 B1 | 7/2014 | Petrovic et al. | |
| 8,884,802 B2 | 11/2014 | Li et al. | |
| 2010/0209092 A1* | 8/2010 | Cheng | G03B 13/00 396/104 |
| 2010/0277355 A1* | 11/2010 | Chen | H03M 1/0665 341/143 |
| 2012/0293346 A1* | 11/2012 | Takayama | H03K 5/249 341/110 |
| 2013/0102264 A1* | 4/2013 | Nakane | H03M 1/1004 455/130 |
| 2014/0266825 A1* | 9/2014 | Li | H03M 1/1009 341/120 |

OTHER PUBLICATIONS

Muhammed Bolatkale et al., *A 4GHz CT ΔΣ ADC with 70dB DR and -74dBFS THD in 125MHz BW*, ISSCC 2011 / Session 27 / Oversampling Converters / 27.1, 2011 IEEE International Solid-State Circuits Conference, 978-1-61284-302-5/11 © 2011 IEEE, 3 pages.

Hajime Shibata et al., *A DC-to-1 GHz Tunable RF ΔΣ ADC Achieving DR= 74 dB and BW= 150 MHz at ƒ0 = 450 MHz Using 550 mW*, © 2012 IEEE, 10 pages.

Yunzhi Dong et al., *A 235mW CT 0-3 MASH ADC Achieving -167dBFS/Hz NSD with 53MHz BW*, ISSCC 2014 / Session 29 / Data Converters for Wireless Systems / 29.2, © 2014 IEEE International Solid-State Circuits Conference, 3 pages.

Do-Yeon Yoon et al., *An 85dB-DR 74.6dB-SNDR 50MHz-BW CT MASH ΔΣ Modulator in 28nm CMOS*, ISSCC 2015 / Session 15 / Data-Converter Techniques / 15.1, 2015 IEEE International Solid State Circuits Conference © 2015 IEEE, 3 pages.

* cited by examiner

FREQUENCY-DOMAIN ADC FLASH CALIBRATION

CROSS-REFERENCE TO RELATED APPLICATIONS

This application claims the benefit of U.S. Provisional Application No. 62/269,656, filed on Dec. 18, 2015. The entire contents of that document are hereby incorporated by reference in their entirety.

TECHNICAL FIELD OF THE DISCLOSURE

Many electronics applications employ an analog-to-digital converter (ADC) to convert an analog input signal to a digital output signal (e.g., for further digital signal processing). The digital output signal can be described as it varies over time. Alternatively, the digital output signal can be described as it varies across frequencies. The present disclosure relates to a calibration of an ADC using a frequency-domain measurement technique.

BACKGROUND

In precision measurement systems, electronics are provided with one or more sensors to make measurements representing real-world phenomena, such as light, sound, temperature, or pressure. These sensors generate analog electrical signals. These analog signals are then provided as an input to an ADC to translate the signals and generate digital output signals. In another instance, an antenna generates an analog signal based on electromagnetic waves carrying information or signals in the air. The analog signal generated by the antenna is then provided as an input to an ADC to generate a digital output signal.

ADCs can be found in broadband communication systems, audio systems, receiver systems, etc. ADCs are used in a broad range of applications including Communications, Energy, Healthcare, Instrumentation and Measurement, Motor and Power Control, Industrial Automation and Aerospace/Defense.

Designing an ADC is a non-trivial task because each application can have different goals in speed, performance, power, cost and size. As the number of applications using ADCs grows, the desire for accurate and reliable conversion performance also grows.

SUMMARY OF THE DISCLOSURE

In certain embodiments, a calibration system to calibrate an offset of a comparator of an analog-to-digital (ADC) converter is provided. The calibration system includes the analog-to-digital converter (ADC), which includes a plurality of comparators that convert an analog input to digital data, the plurality of comparators including the comparator, a fast Fourier transform (FFT) unit to perform an FFT on the digital data to produce a frequency-domain signal, and calibration logic to adjust the offset the comparator based on the frequency-domain signal.

In certain embodiments, a method to calibrate an offset of a comparator of an analog-to-digital (ADC) converter is provided. The method includes converting an analog input to digital data using a plurality of comparators, the plurality of comparators including the comparator; performing a fast Fourier transform on the digital data to produce a frequency-domain signal; and adjusting the offset of the comparator based on the frequency-domain signal.

In certain embodiments, a non-transitory computer-readable medium encoded with instructions that, when executed, cause a processor to perform a method for calibrating an offset of a comparator of an analog-to-digital (ADC) converter is provided. The method includes performing a fast Fourier transform on first digital data received from the ADC to produce a frequency-domain signal; adjusting the offset of the comparator based on the frequency-domain signal; and converting an analog input to second digital data using a plurality of comparators, the plurality of comparators including the comparator.

In certain embodiments, a calibration system to calibrate an offset of a comparator of an analog-to-digital (ADC) converter is provided. The calibration system includes the analog-to-digital converter (ADC), which includes a plurality of comparators that convert an analog input to digital data, the plurality of comparators including the comparator, means for performing an FFT on the digital data to produce a frequency-domain signal; and means for adjusting the offset the comparator based on the frequency-domain signal.

DESCRIPTION OF EXAMPLE EMBODIMENTS OF THE DISCLOSURE

Basics of Analog-to-Digital Converters

ADCs are electronic devices that convert a continuous physical quantity carried by an input analog signal to a digital value that represents, e.g., the quantity's amplitude (or a digital signal carrying that digital value). The conversion involves quantization of the analog signal, so the conversion introduces a small amount of error. Typically, the quantization occurs through periodic sampling of the analog signal. The result is a sequence of digital values (i.e., a digital signal) that has converted a continuous-time and continuous-amplitude analog signal to a discrete-time and discrete-amplitude digital signal.

An ADC is usually defined by the following application requirements: its bandwidth (the range of frequencies of analog signals it can properly convert to a digital signal), its resolution (the number of discrete levels the maximum analog signal can be divided into and represented in the digital signal), and its signal-to-noise ratio (how accurately the ADC can measure a signal relative to the noise the ADC introduces).

Delta-Sigma Analog-to-Digital Converters

ADCs based on delta-sigma (DS) modulation (referred to herein as "DS ADCs") are widely used in digital audio and high precision instrumentation systems. A DS ADC usually provides the advantage of converting an analog input signal to a digital signal with high resolution at low cost.

Figure 1:
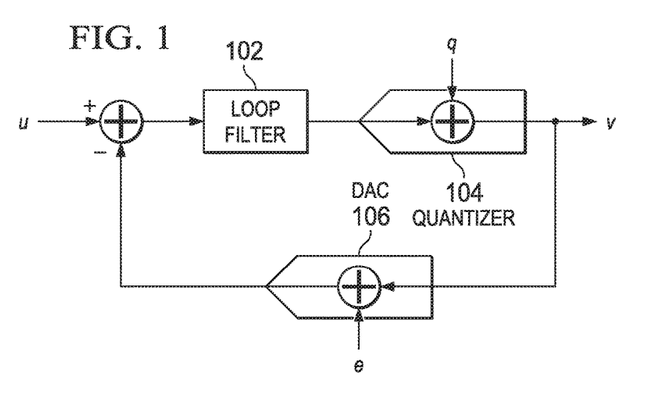
FIG. 1 is a diagram of a delta sigma ADC.

FIG. 1 is an illustrative system diagram of a DS ADC. The DS ADC includes loop filter 102, quantizer 104 (sometimes referred herein as a delta-sigma modulator), and feedback digital-to-analog converter (DAC) 106 (i.e., a DAC in the feedback path of the DS ADC).

Typically, a DS ADC encodes an analog signal u using a DS modulator. The DS ADS includes quantizer 104 for this purpose, employing, e.g., a low resolution ADC, as a 1-bit ADC, Flash ADC, Flash quantizer, etc. Thus, the quantizer includes a comparator. The quantizer 104 inherently introduces quantization noise q. Then, if applicable, the DS ADC can include a digital filter to the output of the quantizer 104 to form a higher-resolution digital output. The output of this stage, whether including only quantizer 104 or additionally the digital filter, is a digitized signal v.

Loop filter 102 has one or more integrators and provides error feedback for the DS ADC. The error is usually generated by taking the difference between the original analog input signal u and a reconstructed version of the original analog input signal generated using feedback DAC 106.

One key characteristic of a DS ADC is its ability to push the quantization noise q to higher frequencies, also referred to as noise shaping. Loop filter 102 helps shape noise fed back from the quantizer 104 out of the baseband to higher frequencies. The amount of noise shaping achieved depends on the order of the loop filter 102.

Feedback DAC 106 is in a feedback configuration with quantizer 104. That is, the digitized signal v is fed to the input of feedback DAC 106. Feedback DAC 106 is generally a multi-bit DAC implemented with a plurality of unit or DAC elements controlled by bits input to the feedback DAC 106. Each one of the unit elements, e.g., current steering cells, generates from the input digitized signal v a part of an analog output signal. The current steering circuits ideally steer the same amount of current to the output. That is, the DAC elements can be weighted the same in certain embodiments. Feedback DAC 106 outputs the analog signal fed back to the input path of the DS ADC.

Frequency-Domain Power Measurement

Flash offsets introduce noise in a DS ADC and can be detrimental to the performance of the ADC. A previous method of calibrating flash offsets measures the noise of the ADC through an RMS meter and adjusts the flash offset calibration codes to minimize the measured noise. For such a system to work, the input signal should be disconnected so that the RMS meter only measures noise. Otherwise, it is difficult to distinguish the noise power from the signal power in the measurement. By disconnecting the input, this calibration method is expected to be performed in the foreground. That is, the calibration is perceived as a one-time calibration with the ADC taken offline. This calibration is not expected to be performed in the background in a continuous calibration where the ADC is not taken offline.

Background calibration is desirable in situations where flash offsets can drift over time and can be corrected without taking the ADC offline. To implement a background calibration, an existing method can be modified such that the RMS power meter rejects the power of the input signal. Typically, the power of the input signal is usually much larger in power than the noise.

Figure 2:
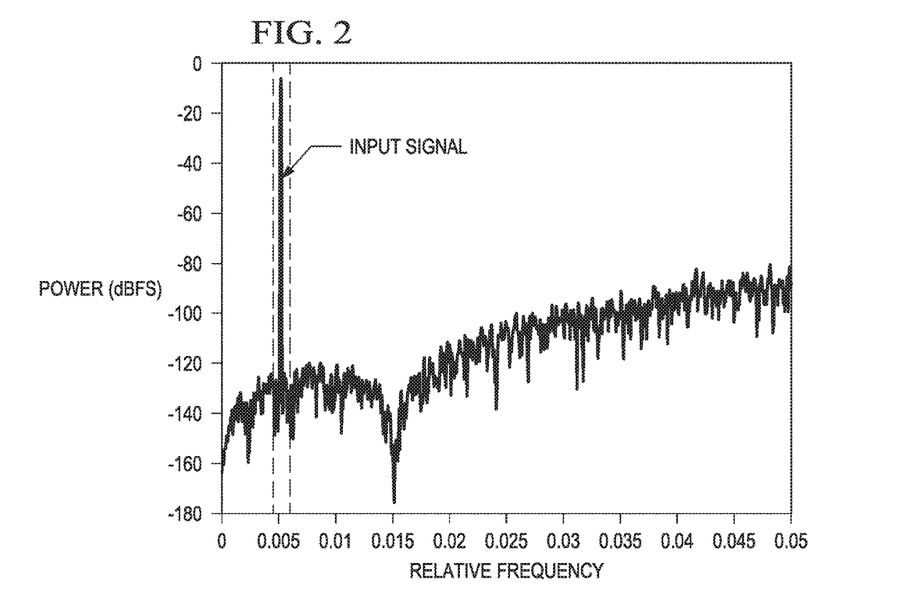
FIG. 2 is a graph illustrating a zoomed-in frequency spectrum of a delta-sigma ADC with an analog input signal.

One solution is to replace the RMS power meter with a frequency-domain power meter and remove the frequency bins associated with the input signal. This solution is illustrated in FIG. 2. In this solution, the ADC noise can be measured by integrating all frequency bins in the frequency spectrum except for bins in close proximity to the input signal. As shown in FIG. 2, the input signal can be removed by removing the frequency components between the two dashed lines (e.g., in close proximity to the input signal).

The frequency-domain power measurement improves consistency and performance in a foreground calibration environment compared to the RMS power measurement method. As previously discussed, the goal of a flash calibration is to minimize the noise of the ADC which, in turn, minimizes the offsets of the flash ADC. More specifically, the noise to be minimized is the in-band noise.

Figure 3:
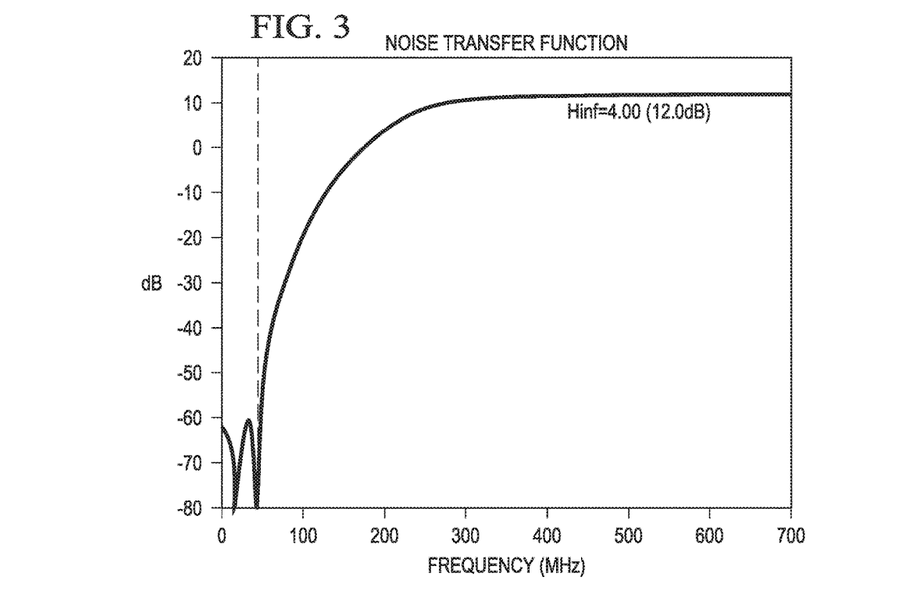
FIG. 3 is a graph illustrating an example output of an ADC with no input signal.

An example output spectrum of an ADC with no input is shown in FIG. 3. Only the noise between 0 and the dashed line, denoted as bandwidth, is what is digitally outputted by the chip. The remaining noise is removed digitally removed via a low-pass filter and does not affect the performance of the ADC.

Figure 4:
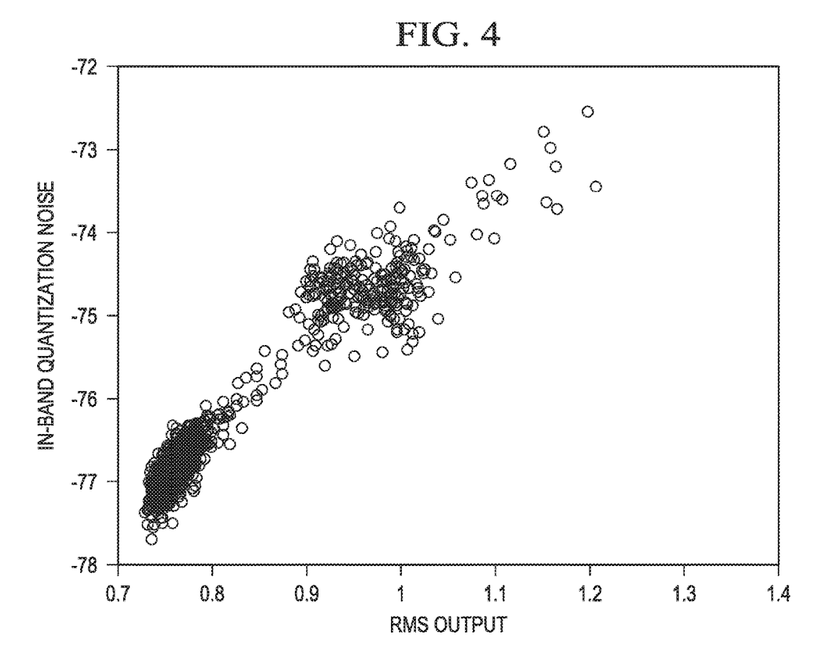
FIG. 4 is a graph illustrating in-band noise vs RMS output.

The conventional foreground calibration method using the RMS power relies on the fact the RMS power of the ADC is correlated with in-band noise. This is shown in FIG. 4 where an ADC's in-band noise is plotted with respect to the measured RMS power for various levels of flash offsets. While this correlation is strong, there is still some uncertainty. With a frequency-domain power measurement method, in-band noise can be directly measured, and both in-band noise and flash offsets can be minimized effectively.

Figure 5:
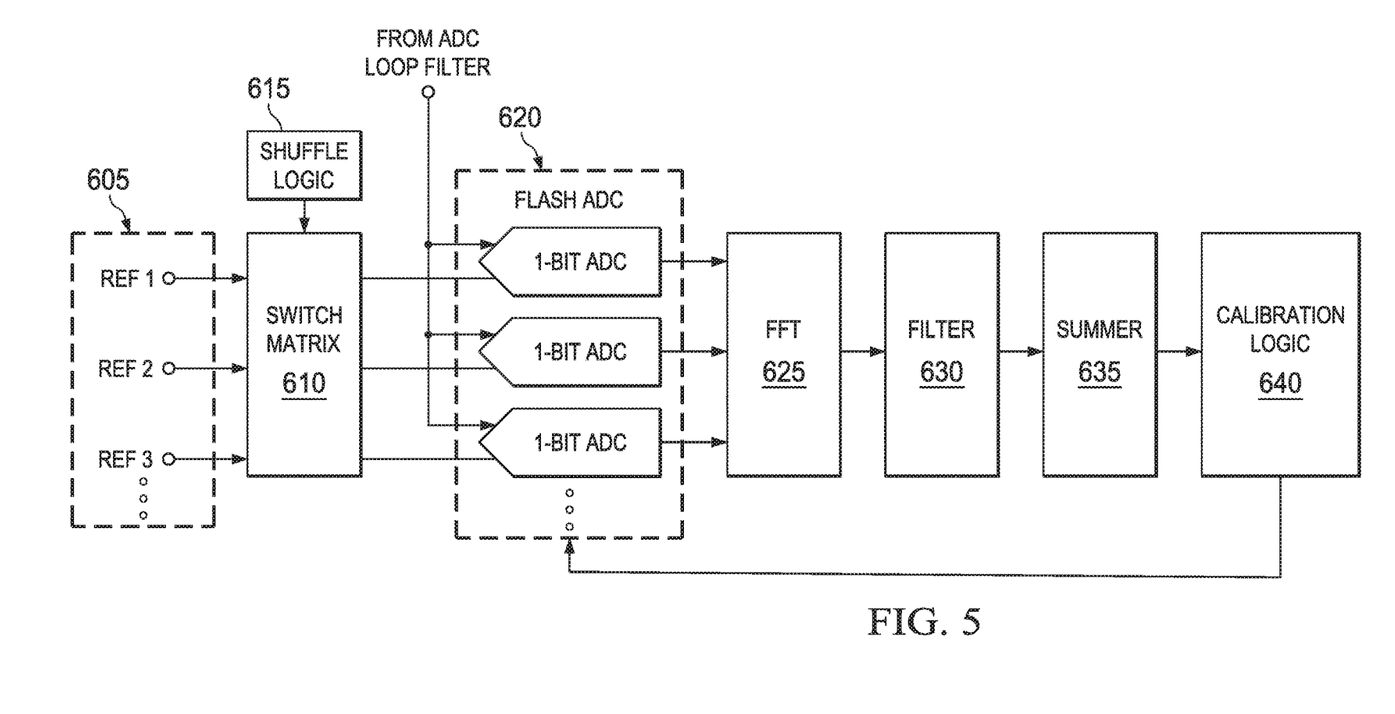
FIG. 5 illustrates a generalized system in accordance with an embodiment of this disclosure.

FIG. 5 illustrates a generalized embodiment of a system in accordance with an embodiment of this disclosure. The system receives a plurality of reference voltages 605. The system includes a switch matrix 610, shuffle logic 615, a flash ADC 620, an FFT unit 625, a frequency filter 630, a frequency summer 635, and calibration logic 640.

Reference voltages 605 establish different thresholds for the later-described comparators.

The switch matrix 610 applies the individual reference voltages 605 to different comparators such that each comparator will eventually see each reference voltage.

The shuffle logic 615 controls the shuffling of the switch matrix 610. For example, in one embodiment, the shuffle logic 615 controls the switch matrix 610 to shuffle the connections to the reference voltages 605 in a partially random fashion during every clock cycle. In other embodiments, the shuffle logic 615 controls the switch matrix 610 to shuffle the connections to the reference voltages 605 in a predetermined order, e.g., successively.

The Flash ADC 620 includes a plurality of 1-bit ADCs which are comparators. The comparators are each structurally similar to the quantizer 104. The 1-bit ADCs receive an analog input from an ADC loop filter, such as loop filter 102. The 1-bit ADCs also receive the reference voltages 605 by way of the switch matrix 610. In addition, 1-bit ADCs receive calibration codes from the calibration logic to adjust the offsets of the comparators.

Each 1-bit ADC compares the analog input to the reference voltage received by the ADC from the switch matrix 610. This comparison is affected by the offset of the comparator. If the analog input is greater than the reference voltage, the ADC outputs a high digital signal. If the analog input is less than the reference voltage, the ADC outputs a low digital signal.

The FFT unit 625 receives the digital signals from the plurality of 1-bit ADCs of the Flash ADC 620. The FFT unit 625 performs an FFT on these outputs to output a spectrum of the received digital signal in the frequency domain. The FFT unit 625 can be implemented in dedicated hardware.

The FFT unit 625 can alternatively be implemented in software on a generic processor. The FFT unit 625 is an example of a means for performing spectrum analysis.

The frequency filter 630 receives a spectrum signal from the FFT unit 625. The frequency filter 630 removes unwanted frequencies from the received spectrum. In particular, the frequency filter 630 filters out-of-band signals and noise. The frequency filter 630 can additionally remove the bins associated with the input signal(s), such as the frequencies discussed previously with regard to FIG. 2. The frequency filter 630 outputs a filtered spectrum signal.

The frequency summer 635 receives the filtered spectrum signal from the frequency filter 630. The frequency summer 635 can thus process only in-band information. Specifically, the frequency summer 635 sums all the remaining frequency bins. This summing is equivalent to taking the power of the in-band information, under Parseval's theorem. Thus, the frequency summer 635 outputs a power signal.

The calibration logic 640 receives a power signal from the summer 635. The calibration logic 640 outputs calibration codes to the Flash ADC 620, thereby adjusting the flash offsets of the flash ADC 615 based on the power signal, as later described. The calibration logic 640 is an example of a means for adjusting an offset of a comparator. The calibration logic 640 includes a processor and a memory.

Figure 6:
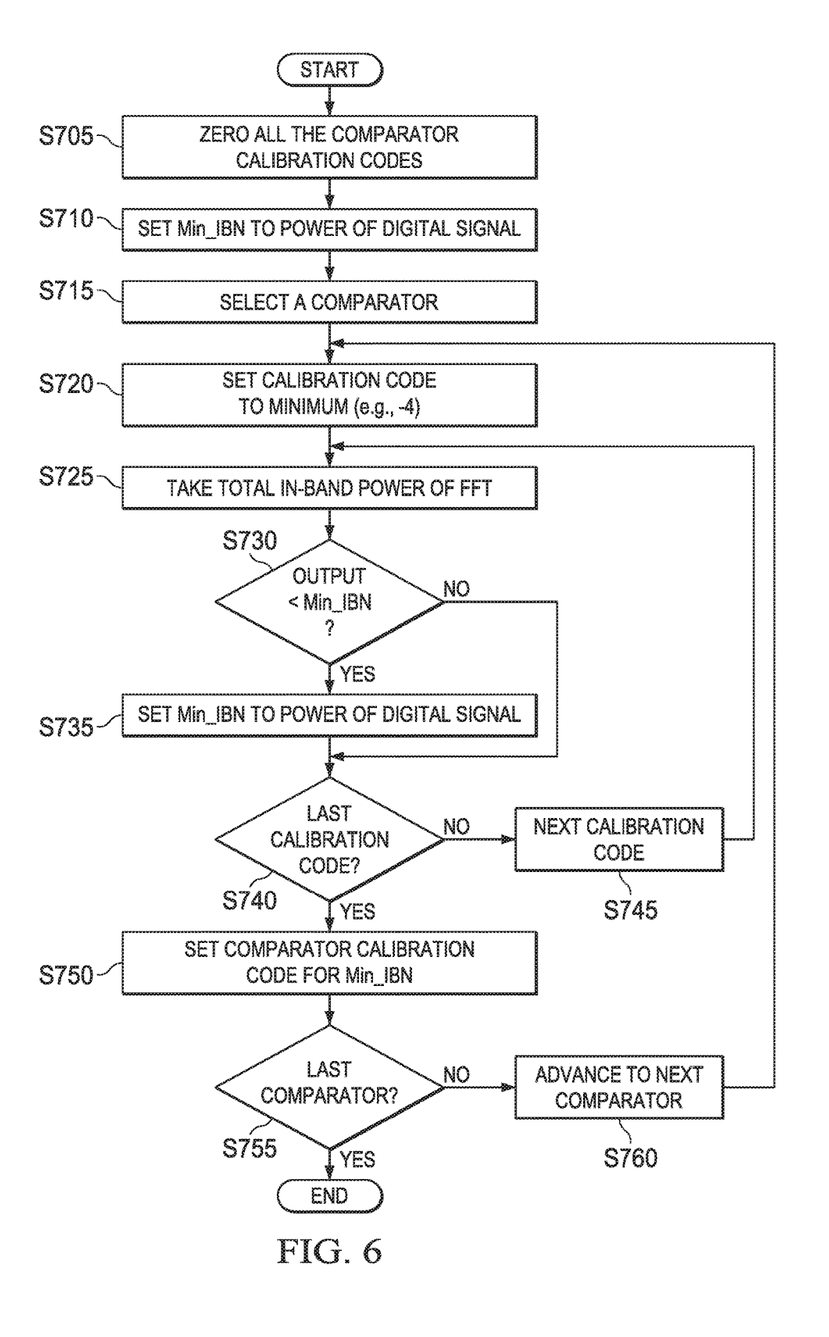
FIG. 6 shows an algorithm for a foreground calibration with a frequency-domain power measurement.

FIG. 6 describes a foreground calibration procedure for flash offsets with a frequency-domain power measurement technique. Instead of attempting to minimize the RMS power of the ADC, this procedure tries to directly minimize the in-band noise of the ADC. In this procedure, the ADC is disconnected from the entire signal chain. This disconnection is performed by disconnecting the analog input to the ADC. Although the analog input to the ADC is disconnected, a small, time-variant, analog noise signal is inherently present on the ADC input.

In the illustrated technique, the calibration logic initially zeroes the calibration codes for all of the comparators of the ADC at S705.

The ADC converts the analog noise signal at the input of the ADC to a digital signal and outputs a digital signal to the FFT unit. The power of the digital signal is then measured at S710.

In particular, the FFT unit takes an FFT of the digital signal and outputs a spectrum signal to the frequency filter. The frequency filter removes, e.g., out-of-band signals and outputs a filtered signal to the frequency summer. The frequency summer receives the filtered signal and sums the filtered signal to produce a sum signal equivalent to the power of the digital signal.

The calibration logic then sets a minimum in-band noise value Min_IBN equal to the power of the digital signal.

Then, the calibration logic selects an initial comparator at S715, and the calibration logic sets a calibration code of that comparator to a minimum at S720. This minimum can be, for example, −4. As described above, the ADC converts an analog noise signal present to an output digital signal based on the calibration code, the FFT unit then takes an FFT of the output digital signal to produce a spectrum signal, the frequency filter filters the spectrum signal, and the frequency summer function sums the filtered signal to output a power signal. Thus, the total in-band power of an FFT of the output signal of the comparator is taken at S725.

In S730, the calibration logic determines whether the taken total in-band power is less than the Min_IBN value. If so, then the calibration logic sets the Min_IBN value to the total in-band power at S735 and stores the corresponding calibration code.

After setting the Min_IBN value to the total in-band power at S735, or if the calibration logic determined at S730 that the total in-band power for this calibration code was not less than the Min_IBN value, then the calibration logic determines at S740 whether the calibration code is the last calibration code for the comparator. For example, in one embodiment, the last calibration code is a maximum code. In one embodiment, this maximum code is 4.

If the calibration logic determines at S740 that the calibration code is not the last one, the calibration logic advances to the next calibration code at S750. For example, the calibration code is incremented. The algorithm then returns to S725.

If the calibration logic determines at S740 that the calibration code is the last one, the calibration logic sets the comparator calibration code for the Min_IBN value at S750. Specifically, the calibration logic sets the comparator calibration code to the last code stored in S735.

The calibration logic then determines at S755 whether the current comparator is the last one at S755. If the calibration logic determines the current comparator is not the last one, the calibration logic advances to the next comparator at S760. The algorithm then proceeds to S720.

If the calibration logic determines the current comparator is the last one (e.g., that the algorithm has been applied to all of the comparators), the algorithm ends. Thus, the algorithm can be performed for all of the comparators.

Figure 7:
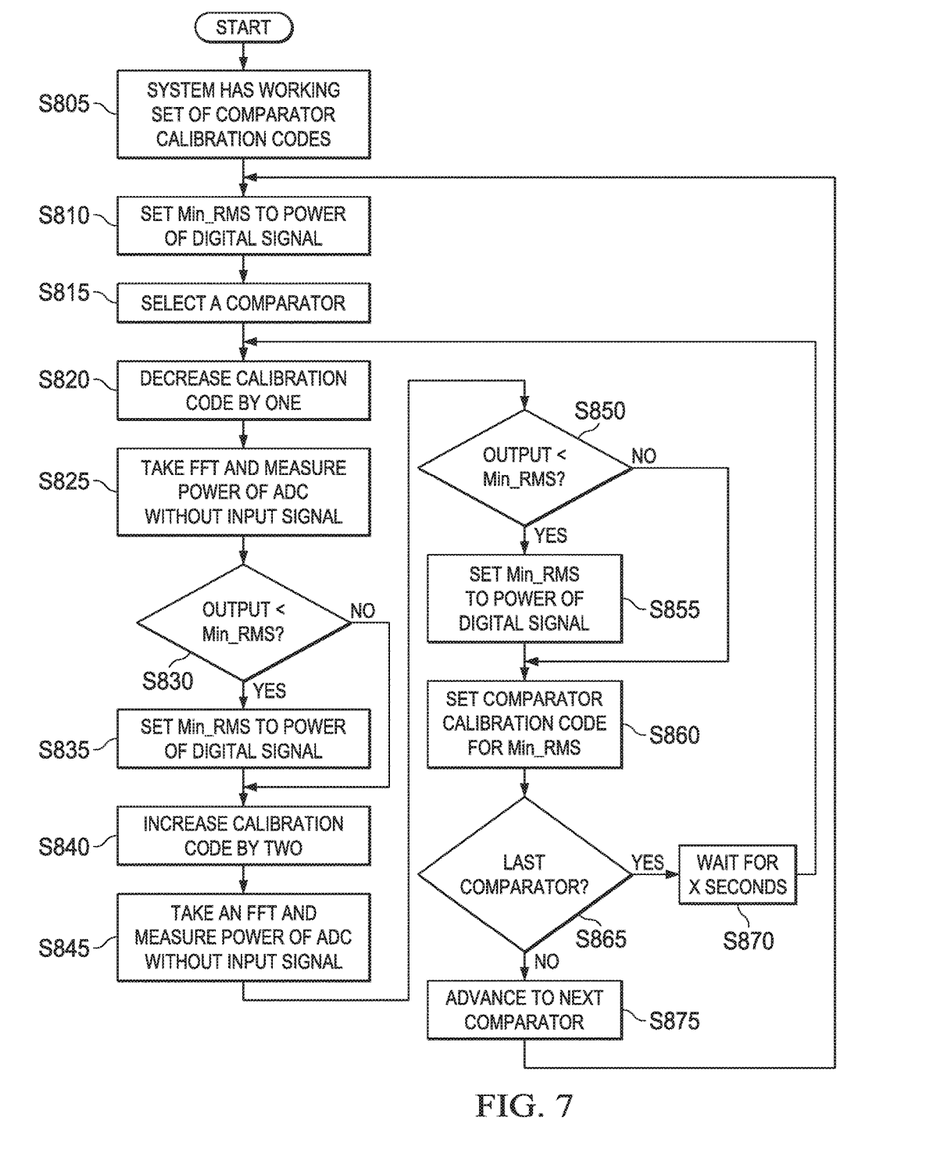
FIG. 7 shows an algorithm for a background calibration with a frequency-domain power measurement.

FIG. 7 describes a background calibration procedure for flash offsets with a frequency-domain power measurement technique. Being a background technique, the ADC is live and operating within the entirety of the signal chain. By taking advantage of the frequency-domain power meter, it is possible to remove the input signal from the power measurement. This removal enables an accurate measurement of the in-band noise without having the measurement be corrupted by the signal power.

The algorithm begins with the system having a working set of comparator calibration codes at S805. For example, the calibration logic can load the comparator codes from a nonvolatile memory. In another embodiment, the calibration logic has the comparator codes in a local cache.

As described above, the ADC converts the analog input signal to a digital output signal based on the calibration code, the FFT unit takes an FFT of the output digital signal and outputs a spectrum, the frequency filter filters out the input signal and outputs a filtered signal, and the frequency summer sums the remaining frequency bins in the filtered signal to produce a sum signal equivalent to the power of the digital signal without the input signal. The calibration logic then sets a value Min_RMS to the power of the digital signal at S810.

The calibration logic then selects an initial comparator at S815. The calibration logic decreases a calibration code by 1 at S820. At S825, as described above, the ADC converts the analog input signal to a digital output signal based on the calibration code, the FFT unit takes an FFT of the output digital signal and outputs a spectrum, the frequency filter filters out the input signal and outputs a filtered signal, and the frequency summer sums the remaining frequency bins in the filtered signal to produce a sum signal equivalent to the power of the digital signal without the input signal.

At S830, the calibration logic determines if the output power of the ADC (i.e., the power signal without the input signal) is less than the Min_RMS value. If the calibration logic determines the output power of the ADC is less than the Min_RMS value, then the calibration logic sets the Min_RMS value to the power signal without the input signal at S735. In addition, the calibration logic stores the calibration code set in S820.

After the calibration logic sets the Min_RMS value to the output power of the ADC at S835 or if calibration logic determines the output power of the ADC is not less than the Min_RMS value, then the calibration logic increases the calibration code by 2 at S840. That is, the calibration code is one higher than the initial calibration code.

As discussed above, the ADC converts the analog input signal to a digital output signal based on the calibration code, and the FFT unit takes an FFT of the digital signal and outputs a spectrum. The frequency filter filters out the input signal and outputs a filtered signal. The frequency summer sums the remaining frequency bins in the filtered signal to produce at S845 a power signal without the input signal to the ADC.

At S850, the calibration logic determines whether the measured power is less than the Min_RMS value. If the calibration logic determines the power measured is less than the Min_RMS value, then the calibration logic sets the Min_RMS value to the power signal at S855. In addition, the calibration logic stores the calibration code set in S840.

After the calibration logic sets the Min_RMS value to the power signal at S855, or if the calibration logic determines the power signal is not less than the Min_RMS value at S850, then the calibration logic sets the comparator code for the Min_RMS value. In particular, the calibration logic sets the comparator code to the calibration code stored in S820 or S855, if such a code resulted in an output less than the Min_RMS value.

Thus, the calibration logic sets the comparator code to the value that minimized the power signal. In one embodiment, the calibration logic stores the comparator code in a nonvolatile memory. In another embodiment, the calibration logic stores the comparator code in a local cache.

At S865, the calibration logic determines whether the calibration code has been set for the last comparator. If the calibration logic determines the current comparator is not the last comparator, then the calibration logic advances to the next comparator at S875, and then returns to S820.

If the calibration logic determines the current comparator is the last comparator, the calibration logic waits for a predetermined period of time, such as X seconds at S870. The algorithm then returns to S820 to set the Min_RMS value to the output.

Figure 8:
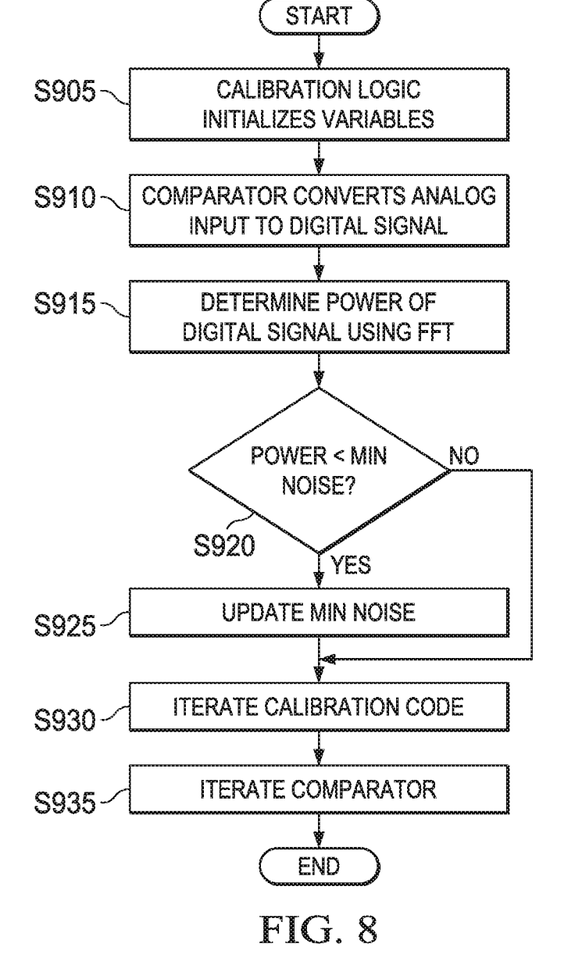
FIG. 8 illustrates a generalized embodiment of an algorithm in accordance with an embodiment of this disclosure.

FIG. 8 illustrates a generalized embodiment of an algorithm in accordance with an embodiment of this disclosure. In S905, the calibration logic initializes variables. These variables include a minimum noise value, an identity of a comparator, and a calibration code for the comparator. The calibration logic transmits the identity of the comparator and the calibration code to the ADC. In this way, the calibration logic selects, among a plurality of comparators in the ADC, the identified comparator and an initial calibration code for that comparator.

The analog input to the ADC may be connected or disconnected. Even if the analog input to the ADC is disconnected, there is inherently a small, time-variant, analog noise at the input to the ADC. Thus, even if the analog input is disconnected, the ADC can convert the analog noise and output a digital signal.

The calibration code adjusts the offset of the identified comparator. This offset modifies the accuracy of the comparator relative to the received analog input. Thus, the identified comparator converts the analog input (whether a signal or noise) to an output based on the initial calibration code. The plurality of the comparators, including the comparator, output the digital output signal.

In S915, the power of the digital output signal is determined. In particular, the FFT unit receives the digital output signal from the ADC and then takes the fast Fourier transform of the digital output signal to produce a spectrum signal. The frequency filter filters out frequencies from the spectrum signal to produce a filtered signal. The frequency summer sums the filtered signal to produce a sum signal equivalent to the power of the digital output signal.

Subsequently, in S920, the calibration logic determines whether the power is minimized (i.e., less than a previous minimum). For example, the power might be a minimum in-band noise or other minimum power. In some embodiments, the minimum power is initialized, whereas in others, the minimum is a value from a previous iteration.

If the calibration logic determines in S920 that the power is less than the previous minimum power, then the calibration logic updates the minimum power in S925 with the power of the digital output signal. The calibration logic also records the associated calibration code.

After the calibration logic updates the minimum power in S925, or if the calibration logic determines in S920 the power is not less than the minimum, then the calibration logic can iterate the calibration of S910, power determination of S915, and conditional updating of S920-S925 for the next calibration code at S930. As shown in FIGS. 5-6, this calibration code is not necessarily a consecutive calibration code.

If the calibration logic has iterated the calibration, power determination, and the conditional updating for all of the relevant calibration codes, then the calibration logic proceeds to S935. The relevant calibration codes can be the full range of calibration codes (e.g., −4 to 4) or a subset therefore (e.g., the first or second neighbors on either side of a predetermined calibration code).

In S935, the algorithm of S905-S930 is iterated for the next comparator. If the algorithm has been iterated for all of the comparators in the ADC, the algorithm concludes.

Other Implementation Notes, Variations, and Applications

In the previous description, the FFT 625 converts the digital output of the ADC to the frequency domain. The filter 630 subsequently performs filtering in the frequency domain on the converted output. In an alternative embodiment, the FFT 625 and the filter 630 can be replaced with a time-domain filter (e.g., a high-pass filter).

The replacement of the FFT 625 and the filter 630 with a time-domain filter is an alternate approach in the background calibration scheme. In the aforementioned background calibration scheme, the input signal is selectively removed via the FFT 625. In contrast, in the time-domain alternative, everything in-band is removed with a high-pass filter, and only the power of the out-of-band signal is measured.

Thus, in the algorithm of FIG. 7, S810 is replaced by the calibration logic measuring an output of the summer and setting a Min_Power value equal to the output of the summer.

S825 is replaced by the calibration logic measuring the output of the summer, and S830 is replaced by the calibration logic determining whether the output of the summer is less than the Min_Power value.

S835 is replaced by the calibration logic setting the Min_Power value to the output of the summer.

S845 is replaced by the calibration logic measuring the output of the summer, and S850 is replaced by the calibration logic determining whether the output of the summer is less than the Min_Power value.

S855 is replaced by the calibration logic setting the Min_Power value to the output of the summer.

S860 is replaced by the calibration logic setting the comparator calibration code for the Min_Power value.

While the embodiments described herein are described in relation to a delta sigma modulator, the method can also be applied to other architectures. In some cases, the calibration technique can also be applied to stand-alone high speed ADCs.

As described above, the filter and the summer are implemented in a digital block separate from the calibration logic. In other embodiments, the calibration logic includes the filter and the summer.

The disclosed techniques can be used to improve the general performance of delta-sigma ADCs, and with proper trade-offs of lower power and/or smaller area. Such ADCs can be found in various automotive applications (e.g., a satellite radio receiver, an accelerometer, tracking control) and health care applications (e.g., magnetic resonance imaging (MRI), ultrasound receivers). In these applications, better performance, lower power, and smaller area are always welcomed.

The foreground frequency-domain calibration technique can lead to better and more consistent offset calibration codes than the conventional RMS method. This improvement arises because the parameter to be improved by calibrating the flash offsets (e.g., in-band noise) is directly measured. In previous methods, total noise is minimized, which, in the absence of an input signal, is correlated with the in-band noise. However, total noise is not exactly the same as in-band noise.

Further, the background frequency-domain calibration technique can allow a calibration of the flash ADC with an input applied. This calibration can allow for a correction of offsets when the ADC is operating in the field. Thus, the calibration can correct for offset shifts due to temperature, power supply, and aging. Conventional foreground calibration schemes do not permit for in-field calibration, as the flash ADC is only calibrated during start-up, and the calibration codes are frozen, while the ADC is operating in the field.

In both cases, the frequency-domain calibration potentially can have improved performance of the ADC (e.g., better in-band noise and higher ADC SNR/DR). If the improved performance is not needed, then the performance improvement can be traded off for lower power/area at the ADC architecture level. To obtain a lower power requirement, the ADC can be designed with higher noise, and the performance degradation can be balanced with the improved flash calibration. To obtain a smaller area, the area of the flash ADC can be reduced at the expense of larger offsets. The frequency-domain calibration method can permit this area reduction.

The calibration logic can be implemented by one or more processors and/or one or more digital signal processors (DSPs). The calibration logic can also be implemented by a PAL (programmable array logic), GAL (generic array logic), an FPGA (field-programmable gate array), or discrete logic. In embodiments in which the calibration logic is implemented partially in software, the software can be stored on a transitory medium (such as a signal) or a non-transitory medium (such as a ROM, RAM, or a disc medium).

In some embodiments, the calibration logic is included on the same chip as the ADC. In other embodiments, the ADC and the calibration logic are not included on the same chip.

In one example embodiment, the electrical circuits of the FIGURES are implemented on a board of an electronic device. The board can be a general circuit board that can hold various components of the internal electronic system of the electronic device and, further, provide connectors for other peripherals. More specifically, the board can provide the electrical connections by which the other components of the system can communicate electrically. Processors (inclusive of digital signal processors, microprocessors, and supporting chipsets) and computer-readable non-transitory memory elements can be coupled to the board based on configuration needs, processing demands, and computer designs. Other components such as external storage, additional sensors, controllers for audio/video display, and peripheral devices can be attached to the board as plug-in cards, via cables, or integrated into the board itself. In various embodiments, the functionalities described herein can be implemented in emulation form as software or firmware running within one or more configurable (e.g., programmable) elements arranged in a structure that supports these emulation functions. The software or firmware providing the emulation can be provided on non-transitory computer-readable storage medium comprising instructions to allow a processor to carry out those functionalities.

In another example embodiment, the electrical circuits of the FIGURES can be implemented as stand-alone modules (e.g., a device with components and circuitry configured to perform a specific application or function) or implemented as plug-in modules into application specific hardware of electronic devices. Particular embodiments of the present disclosure may be included in a system on chip (SOC) package, either in part or in whole. An SOC represents an IC that integrates components of a computer or other electronic system into a single chip. It can contain digital, analog, mixed-signal, and often radio frequency functions: all of which may be provided on a single chip substrate. Other embodiments can include a multi-chip-module (MCM), with a plurality of separate ICs located within a single electronic package and configured to interact closely with each other through the electronic package. In various other embodiments, the digital filters can be implemented in one or more silicon cores in Application Specific Integrated Circuits (ASICs), FPGAs, and other semiconductor chips.

The specifications, dimensions, and relationships outlined herein (e.g., the number of processors, logic operations, etc.) have only been offered for purposes of example and teaching only. Such information can be varied considerably without departing from the spirit of the present disclosure or the scope of the appended claims. The specifications apply only to one non-limiting example and, accordingly, they should be construed as such. In the foregoing description, example embodiments have been described with reference to particular processor and/or component arrangements. Various modifications and changes can be made to such embodiments without departing from the scope of the appended claims. The description and drawings are, accordingly, to be regarded in an illustrative rather than in a restrictive sense.

The present architecture is particularly suitable for high speed, continuous-time, high precision applications where MASH ADCs are used. Applications that can greatly benefit from the architecture include: instrumentation, testing, spectral analyzers, military purposes, radar, wired or wireless communications, mobile telephones (especially as standards continue to push for higher speed communications), and base stations.

With the numerous examples provided herein, interactions can be described in terms of a limited number of electrical components. However, this has been done for purposes of clarity and example only. The system can be consolidated in any manner. Along similar design alternatives, any of the illustrated components, modules, and elements of the FIGURES can be combined in various possible configurations, all of which are within the scope of this disclosure. The electrical circuits of the FIGURES are readily scalable and can accommodate a large number of components, as well as more complicated/sophisticated arrangements and configurations. Accordingly, the examples provided should not limit the scope or inhibit the teachings of the electrical circuits as potentially applied to a myriad of other architectures.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," and the like mean that any such features are included in one or more embodiments of the present disclosure, but may or may not necessarily be combined in the same embodiments.

Some of the operations can be deleted or removed where appropriate, or these operations can be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms can be provided without departing from the teachings of the present disclosure.

Numerous other changes, substitutions, variations, alterations, and modifications can be ascertained to one skilled in the art, and the present disclosure encompasses all such changes, substitutions, variations, alterations, and modifications as falling within the scope of the appended claims. Optional features of the apparatus described above can also be implemented with respect to the method or process described herein, and specifics in the examples can be used anywhere in one or more embodiments.

The invention claimed is:

1. A calibration system to calibrate an offset of a comparator of an analog-to-digital (ADC) converter, comprising:
    the analog-to-digital converter (ADC), which includes a plurality of comparators that convert an analog input to digital data, the plurality of comparators including the comparator;
    a frequency filter to filter out a frequency of the analog input from frequencies of the digital data to produce a filtered signal; and
    calibration logic configured to determine a calibration code for the comparator to reduce a power of the digital data and to adjust the offset of the comparator based on the filtered signal.

2. The calibration system of claim 1, wherein the calibration code for the comparator minimizes the power of the digital data.

3. The calibration system of claim 1, wherein the comparator converts the analog input to digital data based on the calibration code.

4. The calibration system of claim 1, further comprising:
    a frequency summer that sums the filtered signal to produce a power signal, wherein the calibration logic adjusts the offset of the comparator based on the power signal.

5. The calibration system of claim 1, wherein the filter is implemented as a time-domain filter or as a fast Fourier transform unit and a frequency-domain filter.

6. The calibration system of claim 1, wherein the calibration logic is configured to determine a power of the digital data, based on a first calibration code and a second calibration code preceding the first calibration code.

7. The calibration system of claim 1, wherein the calibration logic is configured to determine a power of digital data, based on each calibration code in a full range of calibration codes of the comparator.

8. A method to calibrate an offset of a comparator of an analog-to-digital (ADC) converter, the method comprising:
    converting an analog input to digital data using a plurality of comparators, the plurality of comparators including the comparator;
    filtering out a frequency of the analog input from frequencies of the digital data to produce a filtered signal;
    determining a calibration code for the comparator to minimize a power of the digital data; and
    adjusting the offset of the comparator based on the filtered signal.

9. The method of claim 8, wherein the calibration code for the comparator minimizes the power of the digital data.

10. The method of claim 8, further comprising:
    converting the analog input to digital data based on the calibration code.

11. The method of claim 8, further comprising:
    summing the filtered signal to produce a power signal; and
    adjusting the offset of the comparator based on the power signal.

12. The method of claim 8, further comprising:
    determining that a power of the digital data is less than a predetermined value.

13. The method of claim 8, further comprising:
    determining a power of the digital data, based on a first calibration code and a second calibration code preceding the first calibration code.

14. The method of claim 8, further comprising:
    determining a power of digital data, based on each calibration code in a full range of calibration codes of the comparator.

15. The method of claim 8, wherein the method is performed as a background calibration procedure.

16. A non-transitory computer-readable medium encoded with instructions that, when executed, cause a processor to perform a method for calibrating an offset of a comparator of an analog-to-digital (ADC) converter, the method comprising:
    filtering out a frequency of an analog input from frequencies of digital data received from the ADC to produce a filtered signal;
    determining a calibration code for the comparator to minimize a power of the digital data; and
    adjusting the offset of the comparator based on the filtered signal, wherein the analog input is converted to the digital data using a plurality of comparators, the plurality of comparators including the comparator.

17. The medium of claim 16, wherein the calibration code for the comparator minimizes the power of the digital data.

18. The medium of claim 16, the method further comprising:
    converting the analog input to digital data based on the calibration code.

19. The medium of claim 16, the method further comprising:
    summing the filtered signal to produce a power signal; and
    adjusting the offset of the comparator based on the power signal.

20. The medium of claim 16, the method further comprising:
    determining that a power of the digital data is less than a predetermined value.

21. The medium of claim 16, the method further comprising:
    determining a power of the digital data, based on a first calibration code and a second calibration code preceding the first calibration code.

* * * * *